(12) United States Patent
Uriu et al.

(10) Patent No.: US 6,768,399 B2
(45) Date of Patent: Jul. 27, 2004

(54) LAMINATED BANDPASS FILTER, HIGH FREQUENCY RADIO DEVICE AND LAMINATED BANDPASS FILTER MANUFACTURING METHOD

(75) Inventors: Kazuhide Uriu, Katano (JP); Toru Yamada, Katano (JP); Toshio Ishizaki, Kobe (JP); Tsutomu Matsumura, Yao (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 8 days.

(21) Appl. No.: 10/089,023

(22) PCT Filed: Jun. 19, 2001

(86) PCT No.: PCT/JP01/05201

§ 371 (c)(1),
(2), (4) Date: Aug. 6, 2002

(87) PCT Pub. No.: WO02/09225

PCT Pub. Date: Jan. 31, 2002

(65) Prior Publication Data

US 2003/0048156 A1 Mar. 13, 2003

(30) Foreign Application Priority Data

Jul. 24, 2000 (JP) ........................................ 2000-222263

(51) Int. Cl.[7] ............................. H03H 7/00; H01P 1/203
(52) U.S. Cl. ....................................... 333/204; 333/185
(58) Field of Search ............................... 333/175, 177, 333/184, 185, 204

(56) References Cited

U.S. PATENT DOCUMENTS

| | | | |
|---|---|---|---|
| 5,404,118 A | 4/1995 | Okamura et al. | ............ 333/175 |
| 5,448,209 A | 9/1995 | Hirai et al. | ................. 333/204 |

FOREIGN PATENT DOCUMENTS

| | | | |
|---|---|---|---|
| JP | 63-128801 | 6/1988 | ........... H01P/1/203 |
| JP | 5-283906 | 10/1993 | ........... H01P/1/203 |
| JP | 06-53704 | 2/1994 | ............. H01P/1/20 |
| JP | 6-291511 | 10/1994 | ........... H01P/1/205 |
| JP | 7-212102 | 8/1995 | ........... H01P/1/203 |
| JP | 8-46401 | 2/1996 | ........... H01P/1/203 |
| JP | 11-17404 | 1/1999 | ........... H01P/1/203 |
| JP | 11-88008 | 3/1999 | ........... H01P/1/203 |
| JP | 11-150402 | 6/1999 | ........... H01P/1/203 |
| JP | 11-266103 | 9/1999 | ........... H01P/1/203 |
| JP | 2988500 | 10/1999 | ............. H01P/1/20 |

OTHER PUBLICATIONS

International Search Report corresponding to application No. PCT/JP01/05201 dated Oct. 2, 2001.

English translation of Form PCT/ISA/210.

*Primary Examiner*—Benny Lee
*Assistant Examiner*—Dean Takaoka
(74) *Attorney, Agent, or Firm*—RatnerPrestia

(57) ABSTRACT

The present invention provides a small and low loss laminated bandpass filter by placing two strip lines 313 and 314 that form a resonator in a certain distance on the same layer and thereby electromagnetically coupling these strip lines.

27 Claims, 12 Drawing Sheets

LAMINATED BANDPASS FILTER, HIGH FREQUENCY RADIO DEVICE AND LAMINATED BANDPASS FILTER MANUFACTURING METHOD

THIS APPLICATION IS A U.S. NATIONAL PHASE APPLICATION OF PCT INTERNATIONAL APPLICATION PCT/JP01/05201.

TECHNICAL FIELD

The present invention relates to a laminated band pass filter which is mainly mounted in a high frequency radio device such as a cellular phone, high frequency radio device and laminated bandpass filter manufacturing method.

BACKGROUND ART

With miniaturization of communication equipment, a laminated bandpass filter is used in an RF circuit of a cellular phone, etc. in recent years. With reference to the attached drawings, an example of the above-described conventional bandpass filter will be explained.

FIG. 7 shows an exploded perspective view of a conventional laminated bandpass filter and FIG. 8 shows an equivalent circuit diagram of the conventional laminated bandpass filter.

As shown in FIG. 7, the laminated bandpass filter is constructed of dielectric layer 701 to dielectric layer 710 laminated one atop another. An internal grounding electrode 711 is placed on the dielectric layer 701 and capacitor electrodes 712 and 713 are placed on the dielectric layer 702.

Furthermore, strip lines 714 and 715 are placed on the dielectric layer 703 and strip lines 716 and 717 are placed on the dielectric layer 704 and strip lines 718 and 719 are placed on the dielectric layer 705. Capacitor electrodes 720 and 721 are placed on the dielectric layers 706 and 707 respectively and capacitor electrodes 722 and 723 are placed on the dielectric layer 708, and capacitor electrodes 724 and 725 are placed on the dielectric layer 709.

The capacitor electrode 712, one end 718a of the strip line 718 and the capacitor electrode 721 are connected to the capacitor electrode 722 via a via hole 726 and the capacitor electrode 713, one end 719a of the strip line 719 and the capacitor electrode 720 are connected to the capacitor electrode 723 via a via hole 727.

Furthermore, the other end 718b of the strip line 718 is connected to one end 716a of the strip line 716 via a via hole 728 and the other end 719b of the strip line 719 is connected to one end 717a of the strip line 717 via a via hole 729.

Furthermore, the other end 716b of the strip line 716 is connected to one end 714a of the strip line 714 via a via hole 730 and the other end 717b of the strip line 717 is connected to one end 715a of the strip line 715 via a via hole 731. The internal grounding electrode 711 and strip lines 714 and 715 are connected to a grounding electrode 732 formed on the side of the laminated electronic part and the capacitor electrodes 724 and 725 are connected to an input electrode 733 and an output electrode 734 respectively.

An operation of the conventional laminated bandpass filter will be explained shortly using FIG. 7 and FIG. 8. A capacitor C81 is formed between the capacitor electrode 724 and the capacitor electrode 722 and a capacitor C82 is formed between the capacitor electrode 725 and the capacitor electrode 723.

Furthermore, a capacitor C83 is formed between the capacitor electrode 721 and the capacitor electrode 720.

Further, capacitors C84 and C85 are formed between the capacitor electrodes 712 and 713 and the internal grounding electrode 711 respectively.

An inductor L81 is formed of the strip lines 718, 716 and 714 and an inductor L82 is formed of the strip lines 719, 717 and 715. The capacitor C81 is connected to the input electrode 733 and the capacitor C82 is connected to the output electrode 734. The capacitor C84 and inductor L81 are connected in parallel with the capacitor C81, the capacitor C83 are connected in series to the capacitor C81, the capacitor C85 and inductor L82 are connected in parallel with the capacitor C82, and the capacitor C83 is connected in series to the capacitor C82, and thereby a two-stage bandpass filter is formed.

DISCLOSURE OF THE INVENTION

However, in the above-described configuration, strip lines exist on multiple layers and resistance components in inductors increase, which reduces a Q value, causing a problem that it is impossible to implement a low loss and sharp bandpass filter used for the RF circuit section. Furthermore, since the strip lines are constructed on multiple layers, there is also a problem that it is difficult to implement a small and low-profile laminated body.

In view of the above-described problems, it is an object of the present invention to provide a small, low-profile and low loss laminated bandpass filter, a high frequency radio device that will realize miniaturization by mounting this laminated bandpass filter and a laminated bandpass filter manufacturing method.

One aspect of the present invention is a laminated bandpass filter comprising:

an input electrode, output electrode and grounding electrode placed on an end face of a laminated body integrating a plurality of laminated dielectric sheets;

an internal grounding electrode provided in an internal layer of said laminated body and connected to said grounding electrode;

a plurality of capacitor electrodes including at least a first and second capacitor electrodes; and a plurality of strip lines including at least a first and second strip lines, wherein said first and second capacitor electrodes are capacitatively coupled with said internal grounding electrode and electrically connected to one ends of said first and second strip lines, respectively, the other ends of said first and second strip lines are electrically connected to the grounding electrode, and said first and second strip lines are placed on said same dielectric sheet in a certain distance and thereby electromagnetically coupled within the same layer.

Another aspect of the present invention is the laminated bandpass filter, wherein said first and second strip lines have the same length and width.

Still another aspect of the present invention is the laminated bandpass filter, wherein said first and second strip lines are placed in parallel with each other.

Yet still another aspect of the present invention is the laminated bandpass filter, wherein said first and second strip lines are electrically connected to said internal grounding electrode via a via hole.

Still yet another aspect of the present invention is the laminated bandpass filter, wherein only said first and second strip lines are placed on said dielectric sheet.

A further aspect of the present invention is a laminated bandpass filter comprising:
- an input electrode, output electrode and grounding electrode placed on an end face of a laminated body integrating a plurality of laminated dielectric sheets;
- an internal grounding electrode provided in an internal layer of said laminated body and connected to said grounding electrode;
- a plurality of capacitor electrodes including at least a first and second capacitor electrodes; and
- a plurality of strip lines including at least a first and second strip lines,
- wherein said first and second capacitor electrodes are capacitatively coupled with said internal grounding electrode and electrically connected to one ends of said first and second strip lines, respectively,
- the other ends of said first and second strip lines are electrically connected to the grounding electrode, and
- said first strip line is placed on a first dielectric sheet and said second strip line is placed on a second dielectric sheet, and said second dielectric sheet is placed directly below said first dielectric sheet and said first and second strip lines are electromagnetically coupled.

A still further aspect of the present invention is the laminated bandpass filter, wherein said first and second strip lines have the same length, width and position within the plane.

A yet further aspect of the present invention is the laminated bandpass filter, wherein said first and second strip lines are electrically connected to said internal grounding electrode via a via hole.

A still yet further aspect of the present invention is the laminated bandpass filter, further comprising:
- a third capacitor electrode connected to said input electrode;
- a fourth capacitor electrode connected to said output electrode;
- a fifth capacitor electrode capacitatively coupled with said third capacitor electrode; and
- a sixth capacitor electrode capacitatively coupled with said fourth capacitor electrode,
- wherein capacitive coupling of an area where said third capacitor electrode and said sixth capacitor electrode overlap each other in the lamination direction forms a jump capacitance.

An additional aspect of the present invention is the laminated bandpass filter, wherein capacitative coupling of an area where said fourth capacitor electrode and said fifth capacitor electrode overlap each other in the lamination direction forms a jump capacitance.

A still additional aspect of the present invention is the laminated bandpass filter, wherein with respect to said grounding electrode, an electrode pattern of at least one of said first and second capacitor electrodes is laminated, an electrode pattern of at least one of said first and second strip lines is laminated on a layer superior thereto, and an electrode pattern of at least one of the capacitor electrode connected to said input electrode and the capacitor electrode connected to said output electrode is laminated on a layer superior to said layer.

A yet additional aspect of the present invention is the laminated bandpass filter, wherein all electrode patterns constituting the capacitor electrode connected to said input electrode and the capacitor electrode connected to said output electrode as an input/output capacitance are provided on a layer superior to the layer constituting said strip lines.

A still yet additional aspect of the present invention is the laminated bandpass filter, wherein with respect to said grounding electrode, an electrode pattern of at least one of said first and second capacitor electrodes is laminated, an electrode pattern of at least one of said first and second strip lines is laminated on a layer superior thereto, and an electrode pattern of at least one of said third to sixth capacitor electrodes is laminated on a layer superior to said layer.

A supplementary aspect of the present invention is the laminated bandpass filter, wherein said third to sixth capacitor electrodes are provided on a layer superior to the layer constituting said strip lines.

A still supplementary aspect of the present invention is a laminated bandpass filter comprising:
- an input electrode, output electrode and grounding electrode placed on an end face of a laminated body integrating a plurality of laminated dielectric sheets;
- an internal grounding electrode provided in an internal layer of said laminated body and connected to said grounding electrode;
- a plurality of capacitor electrodes including at least a first to fourth capacitor electrodes; and
- a plurality of strip lines including at least first to fourth strip lines,
- wherein said first to fourth capacitor electrodes are capacitatively coupled with said internal grounding electrode and electrically connected to one ends of said first to fourth strip lines, respectively,
- the other ends of said first to fourth strip lines are electrically connected to the grounding electrode, and
- said first and second strip lines are placed on said first dielectric sheet in a certain distance, said first and second strip lines are electromagnetically coupled within the same layer, said third and fourth strip lines are placed on the second dielectric sheet in a certain distance, said third and fourth strip lines are electromagnetically coupled within the same layer, said second dielectric sheet is placed directly below said first dielectric sheet and said first and third strip lines and said second and fourth strip lines are electromagnetically coupled respectively.

A yet supplementary aspect of the present invention is the laminated bandpass filter, wherein said first to fourth strip lines have the same length and width, said first and third strip lines have the same position within the plane and said second and fourth strip lines have the same position within the plane.

A still yet supplementary aspect of the present invention is the laminated bandpass filter, wherein said first and second strip lines are placed in parallel with each other and said third and fourth strip lines are placed in parallel with each other.

Another aspect of the present invention is the laminated bandpass filter, wherein said first to fourth strip lines are connected to said internal grounding electrode via a via hole.

Still another aspect of the present invention is the laminated bandpass filter, further comprising:
- a fifth capacitor electrode connected to said input electrode;
- a sixth capacitor electrode connected to said output electrode;
- said seventh capacitor electrode capacitatively coupled with said fifth capacitor electrode; and
- said eighth capacitor electrode capacitatively coupled with said sixth capacitor electrode, wherein capacitative coupling of an area where said fifth capacitor electrode and said eighth capacitor electrode overlap each other in the lamination direction forms a jump capacitance.

Yet still another aspect of the present invention is the laminated bandpass filter, wherein capacitative coupling of an area where said sixth capacitor electrode and said seventh capacitor electrode overlap each other in the lamination direction forms a jump capacitance.

Still yet another aspect of the present invention is the laminated bandpass filter, wherein said dielectric sheet is made up of a crystal phase and a glass phase, said crystal phase includes at least one of $Al_2O_3$, $MgO$, $SiO_3$ and $RO_a$ where R is at least one element selected from La, Ce, Pr, Nd, Sm and Gd and a is a numerical value determined stoichiometrically according to the valence of said R.

A further aspect of the present invention is a laminated bandpass filter, said laminated body incorporating the bandpass filter and the bandpass filter.

A still further aspect of the present invention is a composite high frequency device, wherein said laminated body incorporates the bandpass filter and another high frequency circuit.

A yet further aspect of the present invention is a composite high frequency device, wherein electronic parts are mounted on said laminated body incorporating the bandpass filter.

A still yet further aspect of the present invention is a high frequency device, characterized by comprising the laminated bandpass filter.

An additional aspect of the present invention is a laminated bandpass filter manufacturing method comprising the steps of:

forming an input electrode, output electrode and grounding electrode on an end face of a laminated body integrating a plurality of laminated dielectric sheets;

forming an internal grounding electrode in an internal layer of said laminated body connected to said grounding electrode;

forming a plurality of capacitor electrodes including at least a first and second capacitor electrodes; and forming a plurality of strip lines including at least a first and second strip lines, wherein said first and second capacitor electrodes are capacitatively coupled with said internal grounding electrode and electrically connected to one ends of said first and second strip lines, respectively, the other ends of said first and second strip lines are electrically connected to the grounding electrode, and said first and second strip lines are placed on said same dielectric sheet in a certain distance and thereby electromagnetically coupled within the same layer.

A still additional aspect of the present invention is a laminated bandpass filter manufacturing method comprising the steps of:

forming an input electrode, output electrode and grounding electrode on an end face of a laminated body integrating a plurality of laminated dielectric sheets;

forming an internal grounding electrode in an internal layer of said laminated body connected to said grounding electrode;

forming a plurality of capacitor electrodes including at least a first and second capacitor electrodes; and forming a plurality of strip lines including at least a first and second strip lines, wherein said first and second capacitor electrodes are capacitatively coupled with said internal grounding electrode and electrically connected to one ends of said first and second strip lines, respectively, the other ends of said first and second strip lines are electrically connected to the grounding electrode, and said first strip line is placed on a first dielectric sheet, said second strip line is placed on a second dielectric sheet, and said second dielectric sheet is placed directly below said first dielectric sheet and thereby said first and second strip liens are electromagnetically coupled.

A yet additional aspect of the present invention is a laminated bandpass filter manufacturing method comprising the steps of:

forming an input electrode, output electrode and grounding electrode on an end face of a laminated body integrating a plurality of laminated dielectric sheets;

forming an internal grounding electrode in an internal layer of said laminated body connected to said grounding electrode;

forming a plurality of capacitor electrodes including at least a first to fourth capacitor electrodes; and forming a plurality of strip lines including at least first to fourth strip lines, wherein said first to fourth capacitor electrodes are capacitatively coupled with said internal grounding electrode and electrically connected to one ends of said first to fourth strip lines, respectively, the other ends of said first to fourth strip lines are electrically connected to the grounding electrode, and said first and second strip lines are placed on said first dielectric sheet in a certain distance, said first and second strip lines are electromagnetically coupled within the same layer, said third and fourth strip lines are placed on said second dielectric sheet in a certain distance, said third and fourth strip lines are electromagnetically coupled within the same layer, said second dielectric sheet is placed directly below said first dielectric sheet and said first and third strip lines and said second and fourth strip lines are electromagnetically coupled respectively.

DESCRIPTION OF SYMBOLS

Figure 1:
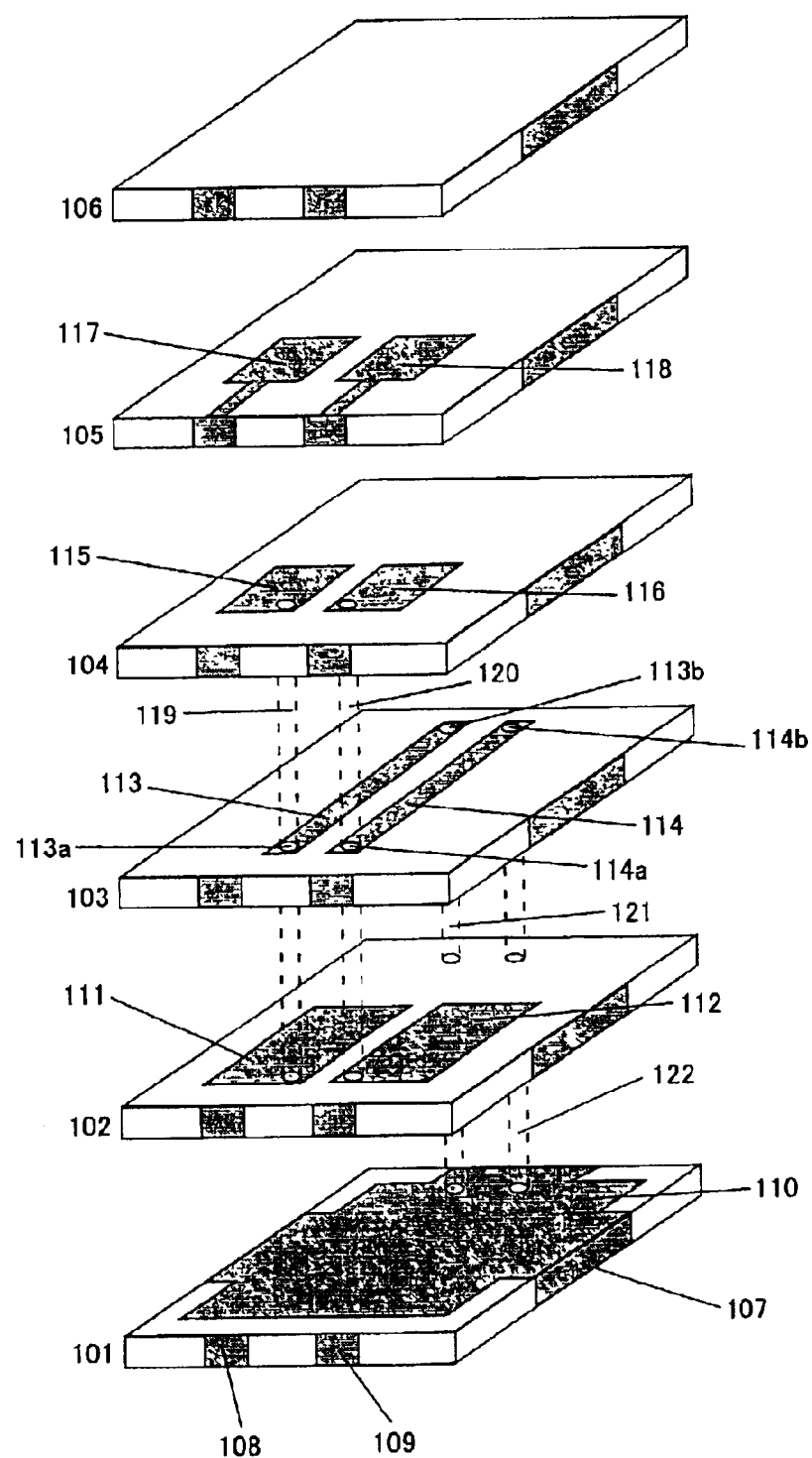
FIG. 1 is an exploded perspective view of a laminated bandpass filter according to Embodiment 1 of the present invention.

107 Grounding electrode
108 Input electrode
109 Output electrode
110 Internal grounding electrode
111, 112, 115, 116, 117, 118 Capacitor electrode
113, 114 Strip line

BEST MODE FOR CARRYING OUT THE INVENTION

Embodiment 1

The laminated bandpass filter of the present invention is mainly suitable for an RF circuit of a high frequency radio device such as a cellular phone. Embodiments of the laminated bandpass filter of the present invention will be explained with reference to the attached drawings below.

Embodiment 1

With reference now to the attached drawings, the laminated bandpass filter and the manufacturing method there of according to Embodiment 1 of the present invention will be explained below.

FIG. 1 is an exploded perspective view of the laminated bandpass filter according to Embodiment 1 of the present invention. As shown in FIG. 1, the laminated bandpass filter of this embodiment consists of dielectric layer 101 to dielectric layer 106 laminated one atop another and the laminated body has dimensions of 3.0 mm×3.0 mm and a height of 0.8 mm.

Each dielectric layer is a dielectric sheet made of a crystal phase and glass phase having a specific inductive capacity $\epsilon_r=7$, the crystal phase being made of $Mg_2SiO_4$ and the glass phase being made of a Si—Ba—La—B—O base. On the sides of the laminated body, a grounding electrode 107, input electrode 108 and output electrode 109 are formed.

An internal grounding electrode 110 is placed on the dielectric layer 101 and connected to the grounding electrode 107. The dielectric layer 102 has capacitor electrodes 111 and 112, and the dielectric layer 103 has strip lines 113 and 114.

Furthermore, the dielectric layer 104 has capacitor electrodes 115 and 116, and the dielectric layer 105 has capacitor electrodes 117 and 118.

Furthermore, the capacitor electrode 117 is connected to the input electrode 108 and the capacitor electrode 118 is connected to the output electrode 109.

The capacitor electrode 115 is connected to one end 113a of the strip line 113 and the capacitor electrode 111 via a via hole 119 and the capacitor electrode 116 is connected to one end 114a of the strip line 114 and the capacitor electrode 112 via a via hole 120.

Furthermore, the other end 113b of the strip line 113 and the other end 114b of the strip line 114 are connected to the internal grounding electrode 110 via a via hole 121 and via hole 122 respectively.

An operation of the laminated bandpass filter configured as shown above will be explained using FIG. 1 and FIG. 2 below.

Figure 2:
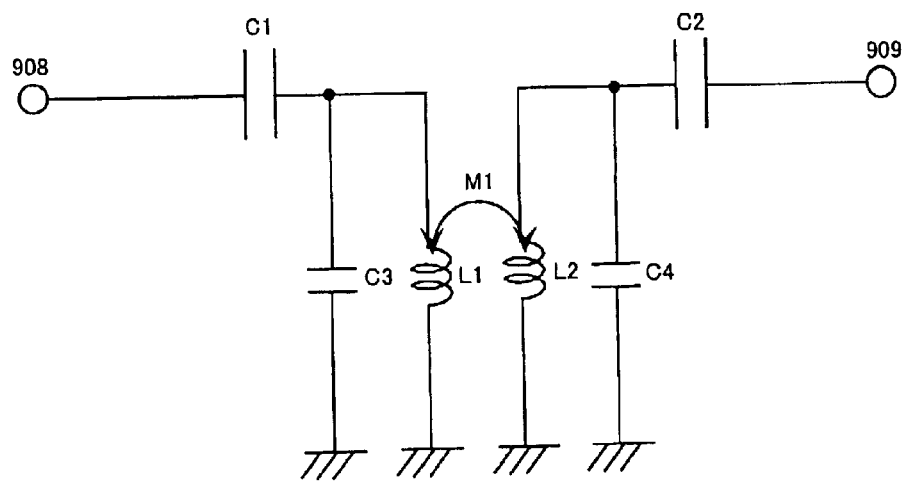
FIG. 2 is an equivalent circuit diagram of the laminated bandpass filter according to Embodiment 1 of the present invention.

First, FIG. 2 shows an equivalent circuit diagram of the laminated bandpass filter shown in FIG. 1 and the elements that correspond to those in FIG. 1 are assigned the same reference numerals as those in FIG. 1. A capacitor C1 is formed between the capacitor electrode 117 and capacitor electrode 115 and a capacitor C2 is formed between the capacitor electrode 118 and capacitor electrode 116.

Furthermore, a capacitor C3 is formed between the capacitor electrode 111 and the internal grounding electrode 110 and a capacitor C4 is formed between the capacitor electrode 112 and the internal grounding electrode 110. Inductors L1 and L2 are formed of the strip lines 113 and 114 respectively. The C1 is connected to the input electrode 108 and the C2 is connected to the output electrode 109.

Furthermore, the L1 and C3 are connected in parallel with the C1 and the L2 and C4 are connected in parallel with the C2 and thereby a two-stage bandpass filter is formed.

Here, the strip lines 113 and 114 formed on the dielectric layer 103 have the same length and width and placed on the plane symmetrically with respect to the center line. Therefore, a mutual inductor M1 acts between the L1 and L2.

This makes it possible to omit a capacitance element between resonators which would be necessary for the conventional configuration and make the laminated body low profile.

Furthermore, by changing the sizes of the capacitor electrodes 111 and 112 that form the capacitors C3 and C4 respectively according to the frequency of the resonator, it is possible to provide a low loss laminated bandpass filter for various frequencies without the need to change the lengths and widths, etc. of the strip lines 113 and 114.

As shown above, Embodiment 1 of the present invention makes it possible to construct a resonator with shorter strip lines than the conventional laminated bandpass filter, which allows high Q for the resonator even with a dielectric material with low material Q.

This makes it possible to design a laminated bandpass filter with insertion loss as low as about 1.5 dB required for an RF circuit section of a high frequency radio device such as a cellular phone.

Placing strip lines in parallel with each other produces electromagnetic coupling and thereby renders a capacitor between resonators unnecessary, which provides a low-profile laminated body.

Embodiment 1 of the present invention has described an example of a laminated bandpass filter in a two-stage configuration, but this configuration also has the same effects with a bandpass filter with three or more stages.

Embodiment 2

A laminated bandpass filter and manufacturing method thereof according to Embodiment 2 of the present invention will be explained with reference to the attached drawings below.

Figure 3:
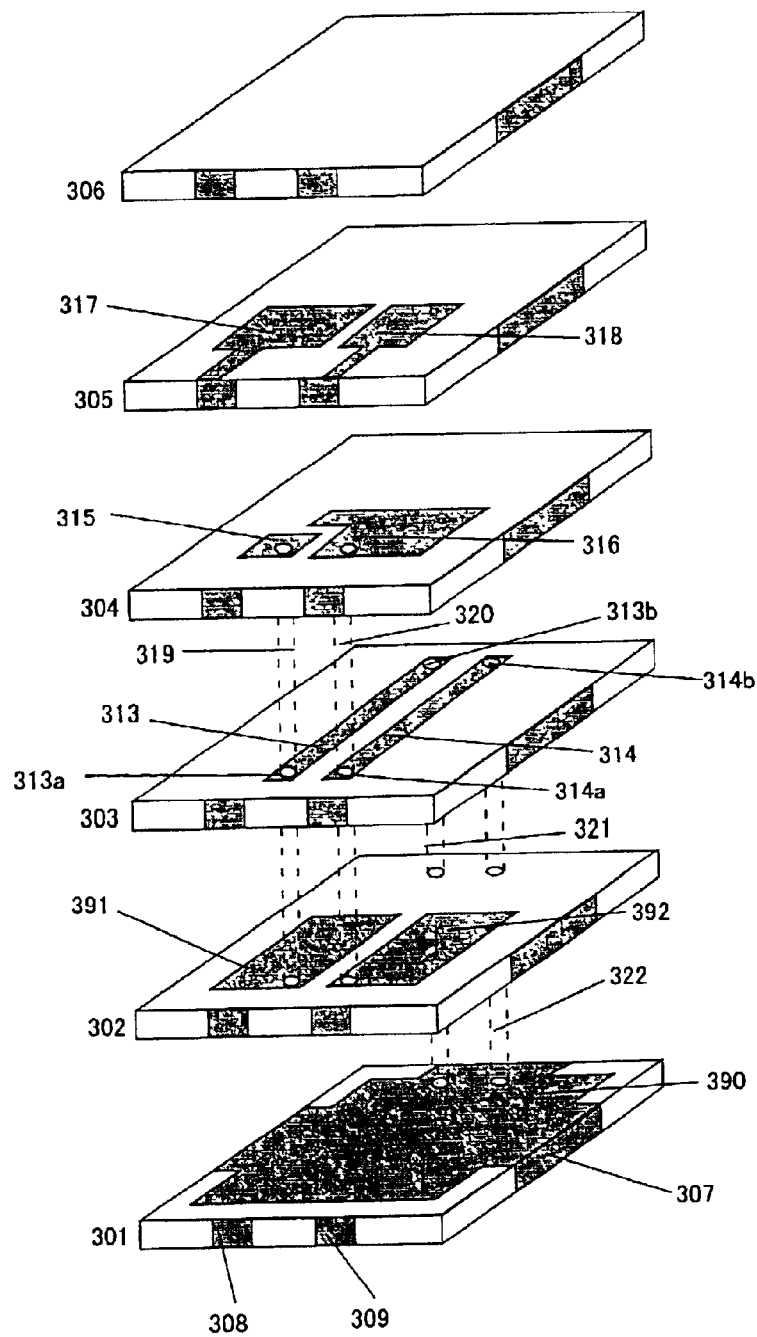
FIG. 3 is an exploded perspective view of a laminated bandpass filter according to Embodiment 2 of the present invention.

FIG. 3 is an exploded perspective view of the laminated bandpass filter according to Embodiment 2 of the present invention. As shown in FIG. 3, the laminated bandpass filter of this embodiment consists of dielectric layer 301 to dielectric layer 306 laminated one atop another and the laminated body has dimensions of 3.0 mm×3.0 mm and a height of 0.8 mm.

A grounding electrode 307, an input electrode 308 and output electrode 309 are formed on the sides of the laminated body. Each dielectric layer is a dielectric sheet made of a crystal phase and glass phase having a specific inductive capacity $\epsilon_r=7$, the crystal phase being made of $Mg_2SiO_4$ and the glass phase being made of a Si—Ba—La—B—O base.

An internal grounding electrode 310 is placed on the dielectric layer 301 and connected to the grounding electrode 307. The dielectric layer 302 has capacitor electrodes 311 and 312, and the dielectric layer 303 has strip lines 313 and 314.

Furthermore, the dielectric layer 304 has capacitor electrodes 315 and 316 and the dielectric layer 305 has capacitor electrodes 317 and 318. Furthermore, the capacitor electrode 317 is connected to the input electrode 308 and the capacitor electrode 318 is connected to the output electrode 309.

The capacitor electrode 315 is connected to one end 313a of the strip line 313 and the capacitor electrode 311 via a via hole 319 and the capacitor electrode 316 is connected to one end 314a of the strip line 314 and the capacitor electrode 312 via a via hole 320.

Furthermore, the other end 313b of the strip line 313 and the other end 314b of the strip line 314 are connected to the internal grounding electrode 310 via a via hole 321 and via hole 322 respectively.

Figure 12:
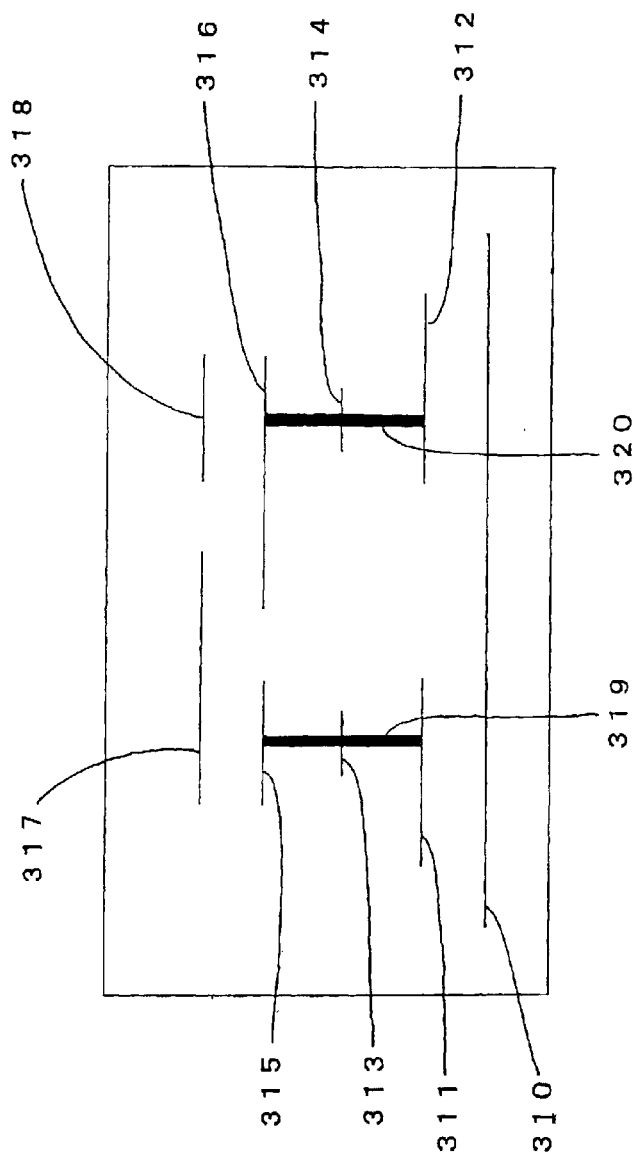
FIG. 12 is a schematic view of a section of the laminated bandpass filter according to Embodiment 2 of the present invention.

FIG. 12 shows a schematic view of a section of the laminated bandpass filter according to this embodiment.

An operation of the laminated bandpass filter configured as shown above will be explained using FIG. 3 and FIG. 4 below.

Figure 4:
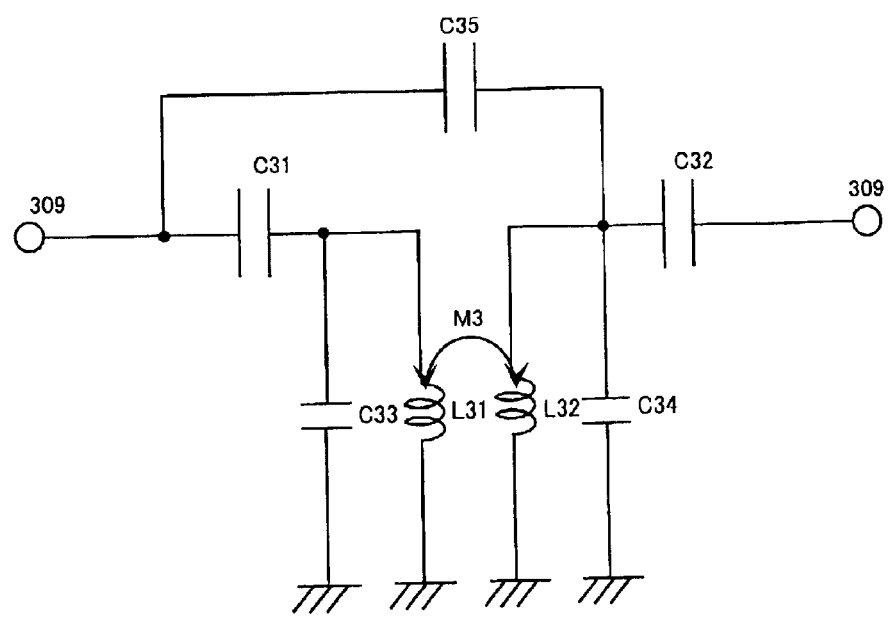
FIG. 4 is an equivalent circuit diagram of the laminated bandpass filter according to Embodiment 2 of the present invention.

First, FIG. 4 shows an equivalent circuit diagram of the laminated bandpass filter shown in FIG. 3 and the elements that correspond to those in FIG. 3 are assigned the same reference numerals as those in FIG. 3. A capacitor C31 is formed between the capacitor electrode 317 and capacitor electrode 315 and a capacitor C32 is formed between the capacitor electrode 318 and capacitor electrode 316.

Furthermore, a capacitor C33 is formed between the capacitor electrode 311 and the internal grounding electrode 310 and a capacitor C34 is formed between the capacitor electrode 312 and the internal grounding electrode 310.

Furthermore, a jump capacitor C35 is formed of an overlapping area between the capacitor electrode 317 and capacitor electrode 316. Inductors L31 and L32 are formed of the strip lines 313 and 314 respectively. The C31 is connected to the input electrode 308 and the C32 is connected to the output electrode 309.

Furthermore, the L31 and C33 are connected in parallel with the C31 and the L32 and C34 are connected in parallel with the C32. Furthermore, the jump capacitor C35 is connected to the input electrode 308 and C32, and in this way a two-stage bandpass filter with poles is formed.

As shown above, unlike Embodiment 1 of the present invention, Embodiment 2 of the present invention makes it possible to provide poles on the high frequency side rather than on the passing band side by forming the jump capacitor C35 between the capacitor electrode 317 and the capacitor electrode 316 without changing the size of the laminated body.

Thus, by changing the size of the overlapping area between the capacitor electrode 317 and capacitor electrode 316 in various ways, this embodiment can change the positions of poles to the high frequency side and improve the attenuation characteristic.

Furthermore, it is also possible to construct a resonator with strip lines shorter than the conventional laminated bandpass filter as in the case of Embodiment 1 of the present invention, which provides a high Q resonator.

Therefore, this makes it possible to design a laminated bandpass filter with low insertion loss required for an RF circuit section of a high frequency radio device such as a cellular phone.

Furthermore, placing strip lines in parallel with each other produces electromagnetic coupling and thereby renders a capacitor between resonators unnecessary, which provides a low-profile laminated body.

Embodiment 2 of the present invention has described an example of a laminated bandpass filter with poles in a two-stage configuration, but this configuration has the same effects with a laminated bandpass filter with three or more stages.

Furthermore, as Embodiment 2 of the present invention, by forming a grounding electrode in the lamination direction, capacitor electrodes which form capacitance with the grounding electrode, strip lines and at least one capacitor electrode that constitutes an input/output capacitance in that order, it is possible to place an electrode pattern that constitutes an input/output capacitance, etc. on a layer sufficiently separated in the lamination direction from the strip lines that form the resonator.

As a result, this eliminates coupling between the strip lines and other electrode patterns, making it possible to form strip lines with a high Q value. This provides a high Q resonator and a lower loss bandpass filter.

Embodiment 3

A laminated bandpass filter and manufacturing method thereof according to Embodiment 3 of the present invention will be explained with reference to the attached drawings below.

Figure 5:
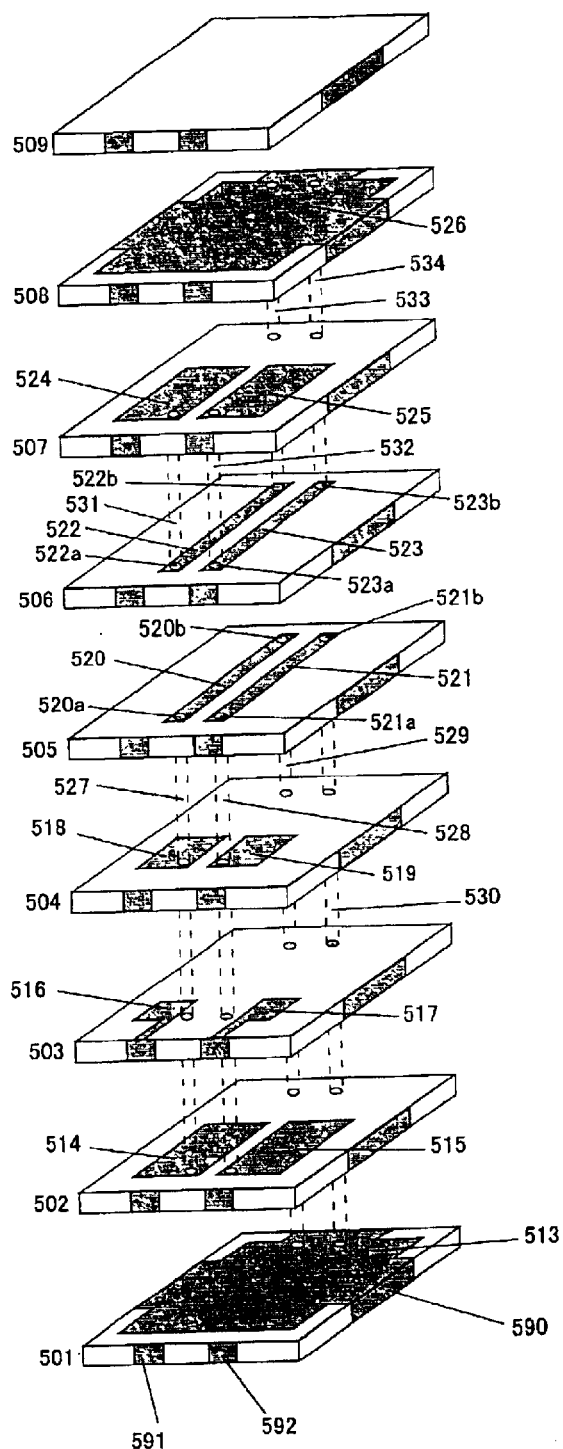
FIG. 5 is an exploded perspective view of a laminated bandpass filter according to Embodiment 3 of the present invention.

FIG. 5 is an exploded perspective view of the laminated bandpass filter according to Embodiment 3 of the present invention.

As shown in FIG. 5, the laminated bandpass filter of this embodiment consists of dielectric layer 501 to dielectric layer 509 laminated one atop another and the laminated body has dimensions of 3.0 mm×3.0 mm and a height of 0.8 mm.

Each dielectric layer is a dielectric sheet made of a crystal phase and glass phase having a specific inductive capacity $\epsilon_r=7$, the crystal phase being made of $Mg_2SiO_4$ and the glass phase being made of a Si—Ba—La—B—O base. A grounding electrode 510, an input electrode 511 and an output electrode 512 are formed on the sides of the laminated body.

An internal grounding electrode 513 is placed on the dielectric layer 501 and connected to the grounding electrode 510. The dielectric layer 502 has capacitor electrodes 514 and 515, the dielectric layer 503 has capacitor electrodes 516 and 517, and the dielectric layer 504 has capacitor electrodes 518 and 519.

Furthermore, the dielectric layer 505 has strip lines 520 and 521, and the dielectric layer 506 has strip lines 522 and 523. The dielectric layer 507 has capacitor electrodes 524 and 525 and the dielectric layer 508 has an internal grounding electrode 526 and connected to the grounding electrode 510.

Furthermore, the capacitor electrode 516 is connected to the input electrode 511 and the capacitor electrode 517 is connected to the output electrode 512. The capacitor electrode 518 is connected to one end 520a of the strip line 520 and the capacitor electrode 514 via a via hole 527 and the capacitor electrode 518 is connected to one end 521a of the strip line 521 and the capacitor electrode 515 via a via hole 528.

Furthermore, the other end 520b of the strip line 520 and the other end 521b of the strip line 521 are connected to the internal grounding electrode 513 via a via hole 529 and via hole 530 respectively.

Furthermore, one end 522a of the strip line 522 is connected to the capacitor electrode 524 via a via hole 531 and the other end 522b is connected to the internal grounding electrode 526 via a via hole 533.

Furthermore, one end 523a of the strip line 523 is connected to the capacitor electrode 525 via a via hole 532 and the other end 523b is connected to the internal grounding electrode 526 via a via hole 534.

An operation of the laminated bandpass filter configured as shown above will be explained using FIG. 5 and FIG. 6 below.

Figure 6:
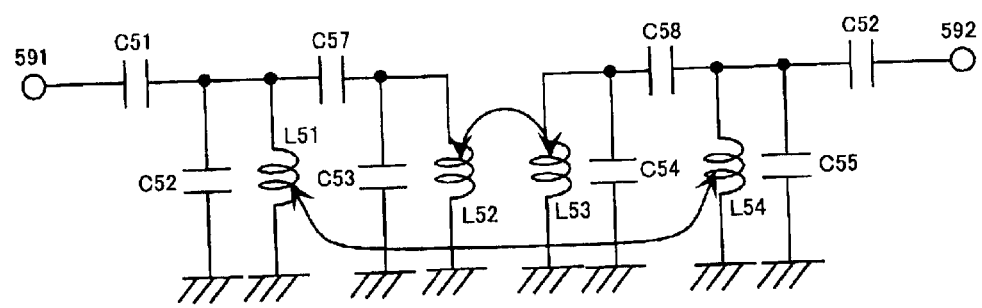
FIG. 6 is an equivalent circuit diagram of the laminated bandpass filter according to Embodiment 3 of the present invention.
Figure 7:
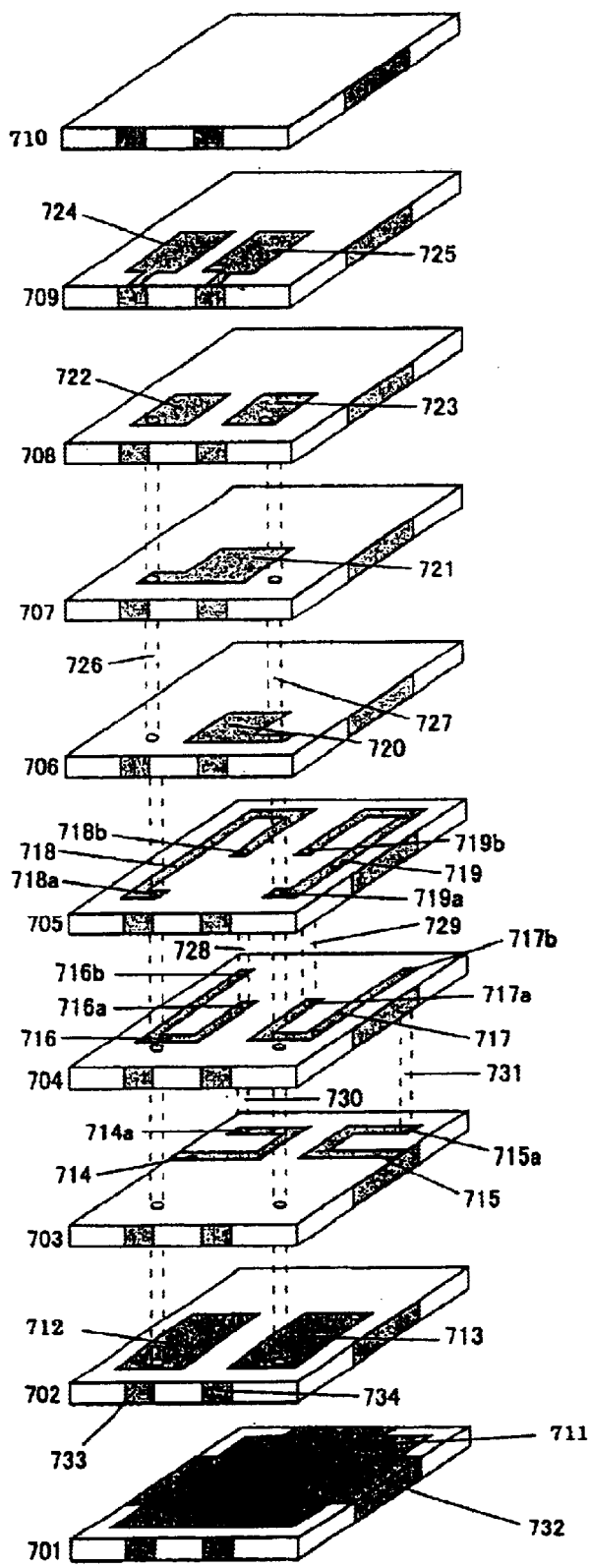
FIG. 7 is an exploded perspective view of a conventional laminated bandpass filter.
Figure 8:
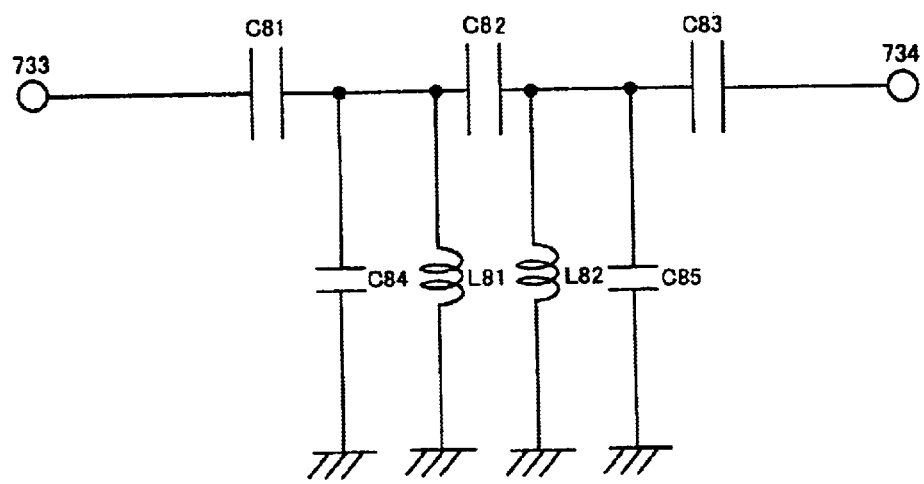
FIG. 8 is an equivalent circuit diagram of the conventional laminated bandpass filter.

First, FIG. 6 shows an equivalent circuit diagram of the laminated bandpass filter shown in FIG. 5 and the elements that correspond to those in FIG. 5 are assigned the same reference numerals as those in FIG. 5.

A capacitor C51 is formed between the capacitor electrode 516 and capacitor electrode 518 and a capacitor C52 is formed between the capacitor electrode 517 and capacitor electrode 519.

A capacitor C53 is formed between the capacitor electrode 514 and the internal grounding electrode 513 and a capacitor C54 is formed between the capacitor electrode 515 and the internal grounding electrode 513.

Furthermore, a capacitor C55 is formed between the capacitor electrode 524 and the internal grounding electrode 526 and a capacitor C56 is formed between the capacitor electrode 525 and the internal grounding electrode 526.

Furthermore, a capacitor C57 is formed of an overlapping area between the strip line 520 and strip line 522 and a capacitor C58 is formed of an overlapping area between the strip line 521 and strip line 523.

Inductors L51, L52, L53 and L54 are formed of the strip lines 520, 521, 522 and 523. The C51 is connected to the input electrode 511 and the C52 is connected to the output electrode 512.

Furthermore, the L51 and C53 are connected in parallel with the C51 and C57 is connected in series to the C51. Furthermore, the L52 and C54 are connected in parallel with the C52 and C58 is connected in series to the C52.

Furthermore, the L53 and C55 are connected in parallel with the C57 and the L54 and C56 are connected in parallel with the C58, thereby forming a 4-stage bandpass filter.

Here, the strip lines 520 and 521 placed on the dielectric layer 505 and the strip lines 522 and 523 placed on the dielectric layer 506 have the same length and width and placed on the planes in the respective layers symmetrically with respect to the center line.

Therefore, a mutual inductor M51 acts between the L51 and L52 and a mutual inductor M52 acts between the L53 and L54. This makes it possible to omit a capacitor element between resonators which would be required for the conventional configuration and make the laminated body low-profile.

Thus, unlike Embodiment 1, Embodiment 3 of the present invention provides a bandpass filter in a 4-stage configuration. This makes it possible to obtain a sharper characteristic and improve insertion loss and attenuation characteristics.

Furthermore, since it is possible to construct a resonator with shorter strip lines than the conventional laminated bandpass filter as in the case of Embodiment 1, this embodiment provides a resonator with high Q.

This makes it possible to design a low loss laminated bandpass filter required for an RF circuit section of a high frequency radio device such as a cellular phone. Furthermore, placing strip lines in parallel with each other produces electromagnetic coupling and thereby renders a capacitor between resonators unnecessary, which provides a low-profile laminated body.

Embodiment 3 of the present invention has described an example of a bandpass filter in a four-stage configuration, but this configuration has the same effects with a bandpass filter in a configuration with five or more stages.

Embodiment 4

A laminated bandpass filter and manufacturing method thereof according to Embodiment 4 of the present invention will be explained with reference to the attached drawings below.

Figure 9:
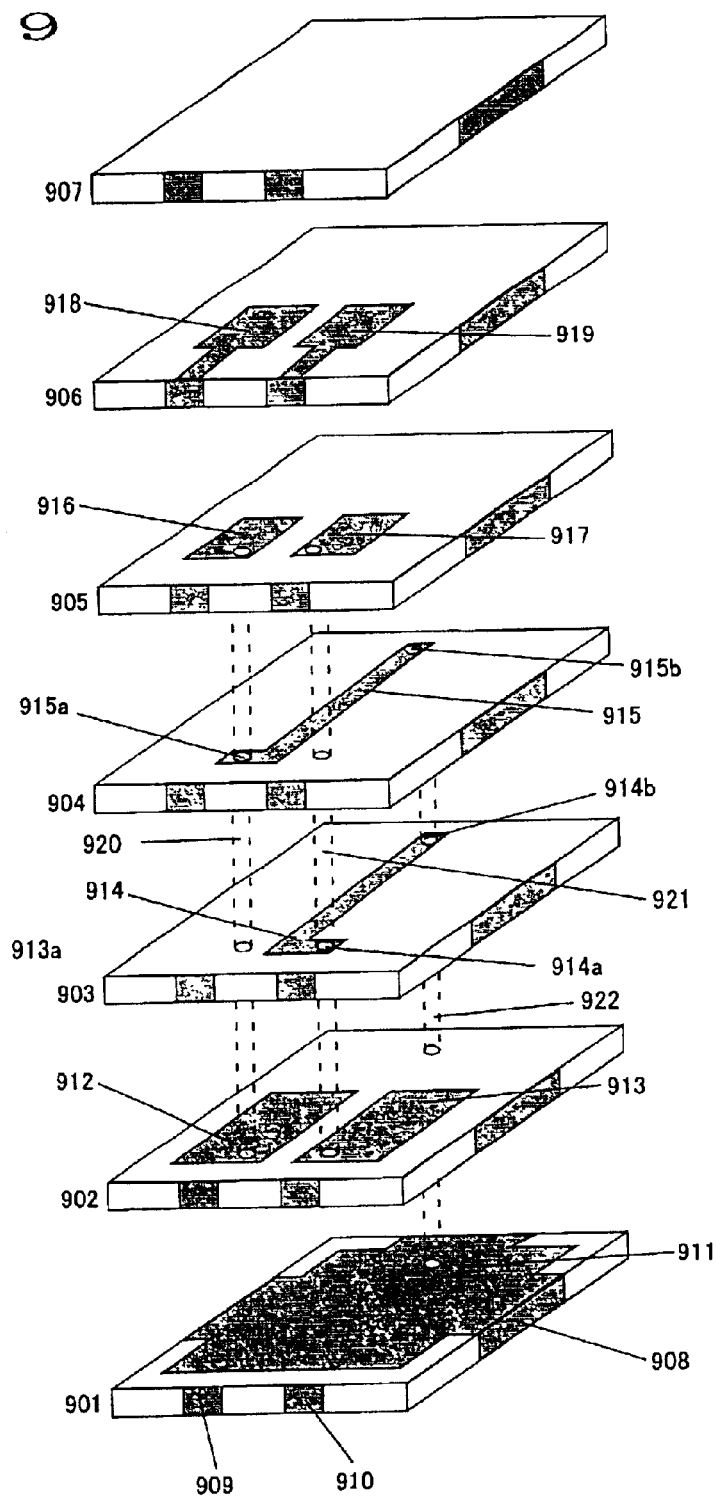
FIG. 9 is an exploded perspective view of a laminated bandpass filter according to Embodiment 4 of the present invention.

FIG. 9 is an exploded perspective view of the laminated bandpass filter according to Embodiment 4 of the present invention.

As shown in FIG. 9, the laminated bandpass filter of this embodiment consists of dielectric layer 901 to dielectric layer 907 laminated one atop another and the laminated body has dimensions of 3.0 mm×3.0 mm and a height of 0.8 mm.

Each dielectric layer is a dielectric sheet made of a crystal phase and glass phase having a specific inductive capacity $\epsilon_r=7$, the crystal phase being made of $Mg_2SiO_4$ and the glass phase being made of a Si—Ba—La—B—O base. A grounding electrode 908, an input electrode 909 and an output electrode 910 are formed on the sides of the laminated body.

An internal grounding electrode 911 is placed on the dielectric layer 901 and connected to the grounding electrode 908. The dielectric layer 902 has capacitor electrodes 912 and 913 and the dielectric layers 903 and 904 have strip lines 914 and 915.

The dielectric layer 905 has capacitor electrodes 916 and 917 and the dielectric layer 906 has capacitor electrodes 918 and 919. Furthermore, the capacitor electrode 918 is connected to the input electrode 909 and the capacitor electrode 919 is connected to the output electrode 910.

The capacitor electrode 916 is connected to one end 915a of the strip line 915 and the capacitor electrode 912 via a via hole 920 and the capacitor electrode 917 is connected to one end 914a of the strip line 914 and the capacitor electrode 913 via a via hole 921.

Furthermore, the other end 914b of the strip line 914 and the other end 915b of the strip line 915 are connected to the internal grounding electrode 911 via a via hole 922.

Since the laminated bandpass filter configured as shown above operates in the same way as that of Embodiment 1, explanations thereof are omitted.

Here, the strip lines 914 and 915 formed on the dielectric layers 903 and 904 have the same length and width and placed on the same place in the lamination direction. This makes a mutual inductor M1 act between the L1 and L2.

This makes it possible to omit a capacitor element between resonators which would be required for the conventional configuration and make the laminated body low profile. Furthermore, by changing the sizes of the capacitor electrodes 912 and 913 that form the capacitor C3 and C4 according to the frequency of the resonator, it is possible to provide a low loss laminated bandpass filter for various frequencies without changing the lengths and widths, etc. of the strip lines 914 and 915.

As shown above, since Embodiment 4 makes it possible to construct a resonator with shorter strip lines than the conventional laminated bandpass filter, this embodiment provides a resonator with high Q even with a dielectric material with low material Q.

This makes it possible to design a laminated bandpass filter with insertion loss as low as 1.5 dB required for an RF circuit section of a high frequency radio device such as a cellular phone. Furthermore, placing strip lines in parallel with each other produces electromagnetic coupling and thereby renders a capacitor between resonators unnecessary, which provides a low-profile laminated body.

Embodiment 4 of the present invention has described an example of a bandpass filter in a two-stage configuration, but this configuration has the same effects with a bandpass filter in a configuration with three or more stages.

Embodiment 5

A laminated bandpass filter and manufacturing method thereof according to Embodiment 5 of the present invention will be explained with reference to the attached drawings below.

Figure 10:
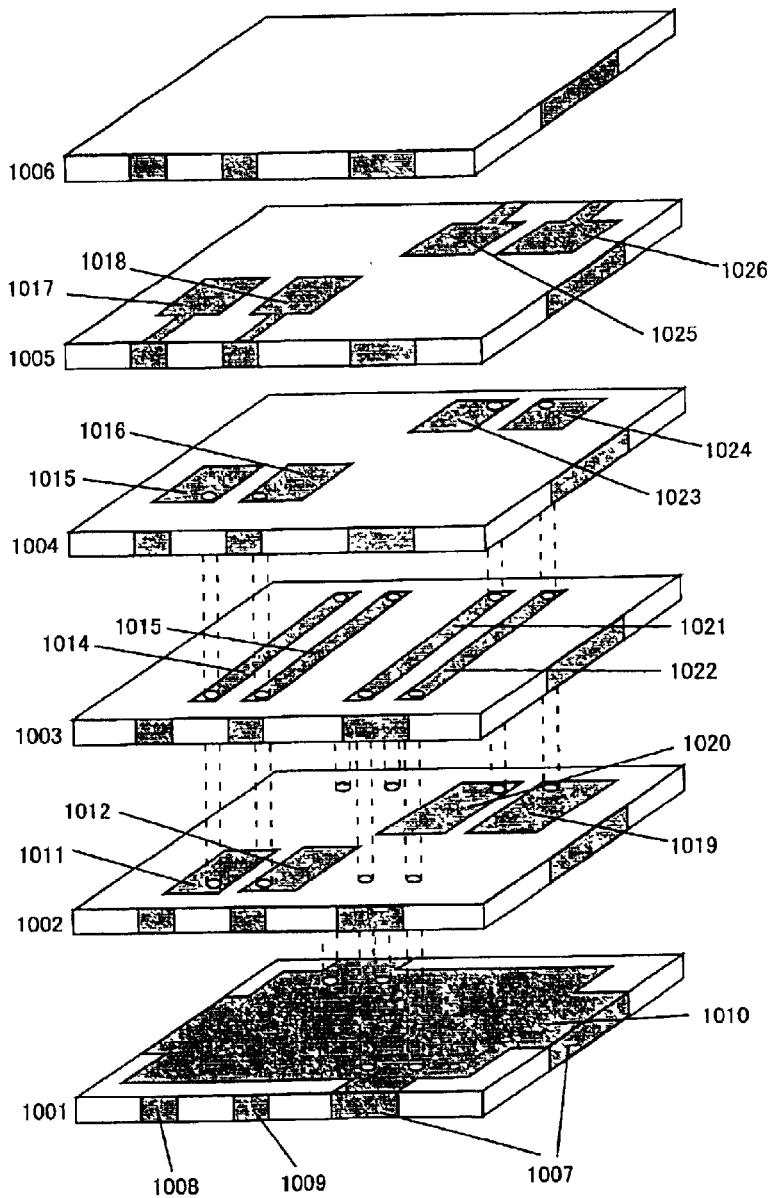
FIG. 10 is an exploded perspective view of a laminated bandpass filter according to Embodiment 5 of the present invention.

FIG. 10 is an exploded perspective view of the laminated bandpass filter according to Embodiment 5 of the present invention.

As shown in FIG. 10, the laminated bandpass filter of this embodiment consists of dielectric layer 1001 to dielectric layer 1006 laminated one atop another and each dielectric layer is a dielectric sheet made of a crystal phase and glass phase having a specific inductive capacity $\epsilon_r=7$, the crystal phase being made of $Mg_2SiO_4$ and the glass phase being made of a Si—Ba—La—B—O base.

Furthermore, as shown in FIG. 10, suppose the laminated bandpass filter of the present invention includes two laminated bandpass filters according to Embodiment 1 of the present invention explained in FIG. 1 and the two bandpass filters have different passing bands.

Here, the main functional correspondence between the components of the laminated bandpass filter shown in FIG. 1 and the components of the laminated bandpass filter shown in FIG. 10 will be explained using reference numerals shown in the respective drawings.

That is, the dielectric layer 101 to dielectric layer 106 in FIG. 1 correspond to the dielectric layer 1001 to dielectric layer 1006 in FIG. 10, and the grounding electrode 107, input electrode 108 and output electrode 109 in FIG. 1 correspond to the grounding electrode 1007, input electrode 1008 and output electrode 1009 in FIG. 10 respectively.

Furthermore, the internal grounding electrode 110 in FIG. 1 corresponds to the internal grounding electrode 1010 in FIG. 10. The capacitor electrodes 111 and 112 in FIG. 1 correspond to the capacitor electrodes 1011 and 1012 and the capacitor electrodes 1019 and 1020 in FIG. 10. The strip lines 113 and 114 in FIG. 1 correspond to the strip lines 1014 and 1015 and the strip lines 1022 and 1021 in FIG. 10.

Furthermore, the capacitor electrodes 115 and 116 in FIG. 1 correspond to the capacitor electrodes 1015 and 1016 and the capacitor electrodes 1024 and 1023. The capacitor electrodes 117 and 118 in FIG. 1 correspond to the capacitor electrodes 1017 and 1018 and the capacitor electrodes 1026 and 1025 in FIG. 10.

Since the laminated bandpass filter configured as shown above operates in the same way as that of Embodiment 1, explanations thereof are omitted and only the differences will be explained.

By including two laminated bandpass filters, Embodiment 5 of the present invention makes it possible to use the common internal grounding electrode 1010, and by placing the grounding electrode between the input and output electrodes of the respective bandpass filters, this embodiment can secure sufficient isolation between the respective input and output electrodes.

This allows mounting with a smaller area than conventional mounting of two laminated bandpass filters and securing sufficient isolation allows one laminated body to include two bandpass filters while maintaining their respective characteristics.

This Embodiment 5 of the present invention has described an example of a bandpass filter that uses different frequency bands as passing bands, but this configuration has the same effects with a bandpass filter that uses a same frequency band as a passing band.

Furthermore, Embodiment 5 of the present invention has described a configuration example of including two bandpass filters, but this configuration has the same effects with three or more bandpass filters.

Figure 11:
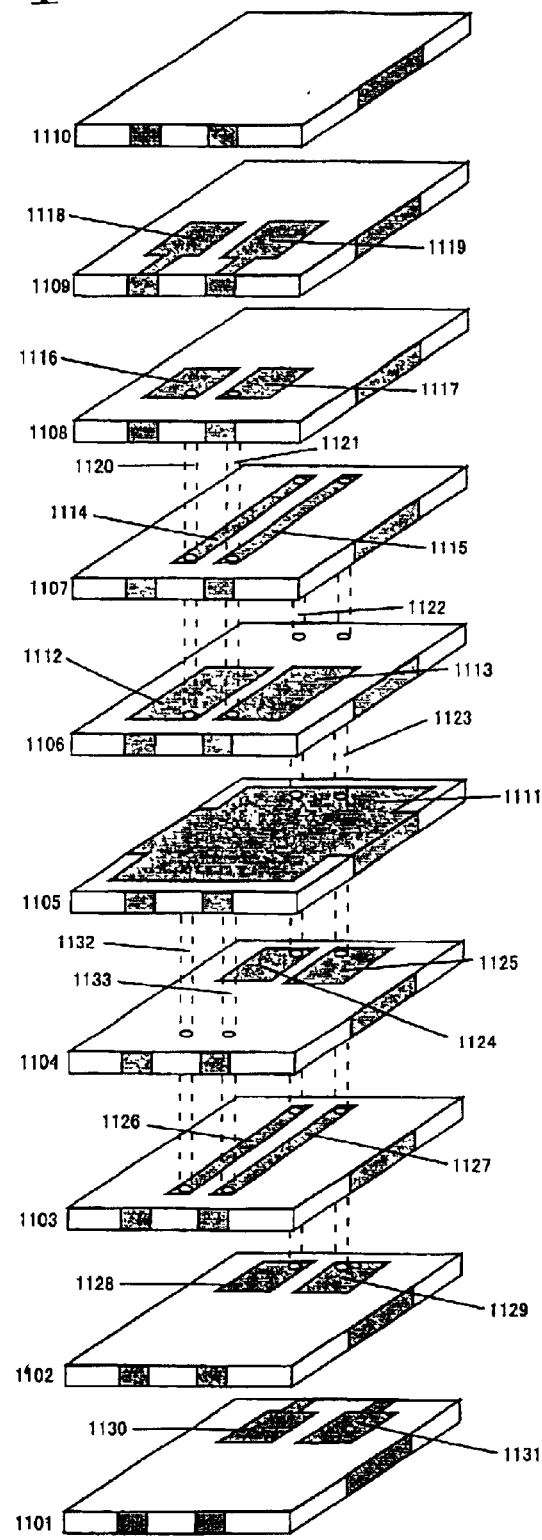
FIG. 11 is another example of an exploded perspective view of the laminated bandpass filter according to Embodiment 5 of the present invention.

Furthermore, FIG. 10 shows a configuration example of placing and including two bandpass filters in the plane direction, but this embodiment is not limited to such a configuration and placing the two bandpass filters in the lamination direction as shown in FIG. 11 can also obtain the same effect as described above.

Here, the main functional correspondence between the components of the laminated bandpass filter shown in FIG. 1 and the components of the laminated bandpass filter shown in FIG. 11 will be explained using reference numerals shown in the respective drawings.

That is, the dielectric layer 101 to dielectric layer 106 in FIG. 1 correspond to the dielectric layer 1105 to dielectric layer 1110 in FIG. 11 and the dielectric layer 101 to dielectric layer 105 in FIG. 1 correspond to the dielectric layer 1105 to dielectric layer 1101 in FIG. 11. That is, the dielectric layer 1105 is shared by the two bandpass filters shown in FIG. 11.

Furthermore, the internal grounding electrode 110 in FIG. 1 corresponds to the grounding electrode 1111 in FIG. 11. The capacitor electrodes 111 and 112 in FIG. 1 correspond to the capacitor electrodes 1112 and 1113 and the capacitor electrodes 1124 and 1125 in FIG. 11. The strip lines 113 and 114 in FIG. 1 correspond to the strip lines 1114 and 1115 and the strip lines 1126 and 1127 in FIG. 11.

Furthermore, the capacitor electrodes 115 and 116 in FIG. 1 correspond to the capacitor electrodes 1116 and 1117 and capacitor electrodes 1128 and 1129 in FIG. 11. The capacitor electrodes 117 and 118 in FIG. 1 correspond to the capacitor electrodes 1118 and 1119 and capacitor electrodes 1130 and 1131 in FIG. 11.

Furthermore, Embodiments 1 to 5 of the present invention have described examples of a dielectric sheet made of a crystal phase and glass phase having a specific inductive capacity $\epsilon_r=7$, dielectric loss tan $\delta=2.0\times10^{-4}$, but the same effect can be obtained even if a dielectric sheet made of a crystal phase and glass phase having a specific inductive capacity $\epsilon_r=5$ to 10 is used.

Furthermore, Embodiments 1 to 5 of the present invention have described examples of a crystal phase of $Mg_2SiO_4$ and glass phase of a Si—Ba—La—B—O base, but the same effect can be obtained using also a crystal phase and a glass phase including at least one of $Al_2O_3$, MgO, $SiO_3$ and $RO_a$ (however, R is at least one element selected from La, Ce, Pr, Nd, Sm and Gd and a is a numerical value determined stoichiometrically according to the valence of R).

Furthermore, Embodiments 1 to 5 of the present invention have described examples of a laminated body having dimensions of 3.0 mm×3.0 mm and a height of 0.8 mm, but the same effects can be obtained irrespective of the dimensions and height of the laminated body.

Examples of the high frequency circuit of the present invention include balun, low pass filter, high pass filter and coupler, etc.

Furthermore, examples of the electronic parts of the present invention include semiconductor parts, SAW filters and chip parts, etc.

As described above, the laminated bandpass filter of the present invention is a laminated body integrating a plurality of dielectric sheets laminated one atop another, comprising an input electrode, output electrode and grounding electrode on the end face of the laminated body, an internal grounding electrode connected to the above-described grounding electrode, a plurality of capacitor electrodes and a plurality of strip lines in the inner layers, wherein the first and second capacitor electrodes are capacitatively coupled with the above-described internal grounding electrode and electrically connected to one end of the first and second strip lines respectively, the other ends of the first and second strip lines are electrically connected to the grounding electrode, the above-described plurality of capacitor electrodes and the above-described plurality of strip lines combined together form a bandpass filter, the above-described first and second strip lines are placed on a same dielectric sheet in a certain distance and thereby electromagnetically coupled within the same layer.

Furthermore, the laminated bandpass filter of the present invention is a laminated body integrating a plurality of dielectric sheets laminated one atop another, comprising an input electrode, output electrode and grounding electrode on the end face of the laminated body, an internal grounding electrode connected to the above-described grounding electrode, a plurality of capacitor electrodes and a plurality of strip lines in the inner layers, wherein the first and second capacitor electrodes are capacitatively coupled with the above-described internal grounding electrode and electrically connected to one end of the first and second strip lines respectively, the other ends of the first and second strip lines are electrically connected to the grounding electrode, the plurality of capacitor electrodes and the plurality of strip lines combined together form a bandpass filter, the above-described first strip line is placed on a first dielectric sheet and the above-described second strip line is placed on a second dielectric sheet and the second dielectric sheet is placed directly below the first dielectric sheet and thereby the first and second strip lines are electromagnetically coupled.

Furthermore, the laminated bandpass filter of the present invention is a laminated body integrating a plurality of dielectric sheets laminated one atop another, comprising an input electrode, output electrode and grounding electrode on the end face of the laminated body, an internal grounding electrode connected to the above-described grounding electrode, a plurality of capacitor electrodes and a plurality of strip lines in the inner layers, wherein the first to fourth capacitor electrodes are capacitatively coupled with the above-described internal grounding electrode and electrically connected to one end of the first to fourth strip lines respectively, the other ends of the first to fourth strip lines are electrically connected to the grounding electrode, the above-described plurality of capacitor electrodes and the plurality of strip lines combined together form a bandpass filter, the first and second strip lines are placed on a first dielectric sheet in a certain distance, the first and second strip lines are electromagnetically coupled within the same layer, the above-described third and fourth strip lines are placed in a certain distance on the second dielectric sheet, the third and fourth strip lines are electromagnetically coupled within the same layer, further the above-described second dielectric sheet is placed directly below the first dielectric sheet and the above-described first and third strip lines and the above-described second and fourth strip lines are electromagnetically coupled respectively.

Industrial Applicability

As described above, the present invention can omit a capacitance element between resonators which would be necessary for the conventional configuration and provide a smaller and low-profile laminated bandpass filter. Mounting this laminated bandpass filter in an RF circuit of a high frequency radio device can contribute to miniaturization of the high frequency radio device.

The present invention makes it possible to construct a resonator with shorter strip lines than the conventional structure, which allows high Q for the resonator and can provide a laminated bandpass filter with lower loss.

What is claimed is:

1. A laminated bandpass filter comprising:

an input electrode, output electrode and grounding electrode placed on an end face of a laminated body integrating a plurality of laminated dielectric sheets;

an internal grounding electrode provided in an internal layer of said laminated body and connected to said grounding electrode;

a plurality of capacitor electrodes including at least first and second capacitor electrodes; and a plurality of strip lines including at least first and second strip lines, wherein said first and second capacitor electrodes are capacitatively coupled with said internal grounding electrode and electrically connected to ends of said first and second strip lines, respectively, the other ends of said first and second strip lines are electrically connected to the grounding electrode, and said first and second strip lines are each shaped in a straight line, (i) are placed on the same dielectric sheet, (ii) have the same length and width, (iii) are placed symmetrically with respect to a center line between said first and second strip lines, and (iv) said first and second strip lines are placed in parallel with each other through their entire lengths and separated by a certain distance, and thereby are electromagnetically coupled to each other within the same layer.

2. The laminated bandpass filter according to claim 1, wherein said first and second strip lines are electrically connected to said internal grounding electrode via a via hole.

3. The laminated bandpass filter according to claim 1, wherein only said first and second strip lines are placed on said dielectric sheet.

4. A laminated bandpass filter manufacturing method comprising the steps of:

forming an input electrode, output electrode and grounding electrode on an end face of a laminated body integrating a plurality of laminated dielectric sheets;

forming an internal grounding electrode in an internal layer of said laminated body connected to said grounding electrode;

forming a plurality of capacitor electrodes including at least first to fourth capacitor electrodes; and forming a plurality of strip lines including at least first to fourth strip lines, wherein said first to fourth capacitor electrodes are capacitatively coupled with said internal grounding electrode and electrically connected to ends of said first to fourth strip lines, respectively, the other ends of said first to fourth strip lines are electrically connected to the grounding electrode, and said first and second strip lines are placed on said first dielectric sheet in a certain distance, said first and second strip lines are electromagnetically coupled within the same layer, said third and fourth strip lines are placed on said second dielectric sheet in a certain distance, said third and fourth strip lines are electromagnetically coupled within the same layer, said second dielectric sheet is placed directly below said first dielectric sheet and said first and third strip lines and said second and fourth strip lines are electromagnetically coupled respectively.

5. A laminated bandpass filter comprising:

an input electrode, output electrode and grounding electrode placed on an end face of a laminated body integrating a plurality of laminated dielectric sheets;

an internal grounding electrode provided in an internal layer of said laminated body and connected to said grounding electrode;

a plurality of capacitor electrodes including at least first and second capacitor electrodes; and a plurality of strip lines including at least first and second strip lines, wherein said first and second capacitor electrodes are capacitatively coupled with said internal grounding electrode and electrically connected to ends of said first and second strip lines, respectively, the other ends of said first and second strip lines are electrically connected to the grounding electrode, and said first and second strip lines are placed on said same dielectric sheet in a certain distance and thereby electromagnetically coupled within the same layer, wherein said first and second strip lines are electrically connected to said internal grounding electrode via a via hole.

6. A laminated bandpass filter comprising:

an input electrode, output electrode and grounding electrode placed on an end face of a laminated body integrating a plurality of laminated dielectric sheets;

an internal grounding electrode provided in an internal layer of said laminated body and connected to said grounding electrode;

a plurality of capacitor electrodes including at least first and second capacitor electrodes; and a plurality of strip lines including at least first and second strip lines, wherein said first and second capacitor electrodes are capacitatively coupled with said internal grounding electrode and electrically connected to ends of said first and second strip lines, respectively, the other ends of said first and second strip lines are electrically connected to the grounding electrode, and said first strip line is placed on a first dielectric sheet and said second strip line is placed on a second dielectric sheet, and said second dielectric sheet is placed directly below said first dielectric sheet and said first and second strip lines are electromagnetically coupled.

7. The laminated bandpass filter according to claim 6, wherein said first and second strip lines have the same length, width and position within the plane.

8. The laminated bandpass filter according to claim 6 or claim 7, wherein said first and second strip lines are electrically connected to said internal grounding electrode via a via hole.

9. The laminated bandpass filter according to any one of claims 1, 6 and 7, further comprising:

a third capacitor electrode connected to said input electrode;

a fourth capacitor electrode connected to said output electrode;

a fifth capacitor electrode capacitatively coupled with said third capacitor electrode; and a sixth capacitor electrode capacitatively coupled with said fourth capacitor electrode, wherein capacitative coupling of an area where said third capacitor electrode and said sixth capacitor electrode overlap each other in the lamination direction forms a jump capacitance.

10. The laminated bandpass filter according to any one of claims 1, 6 and 7, wherein capacitative coupling of an area where said fourth capacitor electrode and said fifth capacitor electrode overlap each other in the lamination direction forms a jump capacitance.

11. The laminated bandpass filter according to any one of claims 1, 6 and 7, wherein with respect to said internal grounding electrode, on a layer superior thereto, an electrode pattern of at least one of said first and second capacitor electrodes is laminated, an electrode pattern of at least one of said first and second strip lines is laminated on a layer superior thereto, and an electrode pattern of at least one of the capacitor electrode connected to said input electrode and the capacitor electrode connected to said output electrode is laminated on a layer superior to said layer.

12. The laminated bandpass filter according to any one of claims 1, 6 and 7, wherein all electrode patterns constituting the capacitor electrode connected to said input electrode, the capacitor electrode connected to said output electrode and an input/output capacitance are provided on a layer superior to the layer constituting said strip lines.

13. The laminated bandpass filter according to claim 9, wherein with respect to said internal grounding electrode, on a layer superior thereto, an electrode pattern of at least one of said first and second capacitor electrodes is laminated, an electrode pattern of at least one of said first and second strip lines is laminated on a layer superior thereto, and an electrode pattern of at least one of said third to sixth capacitor electrodes is laminated on a layer superior to said layer.

14. The laminated bandpass filter according to claim 9, wherein said all of third to sixth capacitor electrodes are provided on a layer superior to the layer constituting said strip lines.

15. A laminated bandpass filter comprising:

an input electrode, output electrode and grounding electrode placed on an end face of a laminated body integrating a plurality of laminated dielectric sheets;

an internal grounding electrode provided in an internal layer of said laminated body and connected to said grounding electrode;

a plurality of capacitor electrodes including at least a first to fourth capacitor electrodes; and a plurality of strip lines including at least first to fourth strip lines, wherein said first to fourth capacitor electrodes are capacitatively coupled with said internal grounding electrode and electrically connected to one ends of said first to fourth strip lines, respectively, the other ends of said first to fourth strip lines are electrically connected to the grounding electrode, and said first and second strip lines are placed on said first dielectric sheet in a certain distance, said first and second strip lines are electromagnetically coupled within the same layer, said third and fourth strip lines are placed on the second dielectric sheet in a certain distance, said third and fourth strip lines are electromagnetically coupled within the same layer, said second dielectric sheet is placed directly below said first dielectric sheet and said first and third strip lines and said second and fourth strip lines are electromagnetically coupled respectively.

16. The laminated bandpass filter according to claim 15, wherein said first to fourth strip lines have the same length and width, said first and third strip lines have the same position within the plane and said second and fourth strip lines have the same position within the plane.

17. The laminated bandpass filter according to claim 15 or claim 16, wherein said first and second strip lines are placed in parallel with each other and said third and fourth strip lines are placed in parallel with each other.

18. The laminated bandpass filter according to claims 15 or 16, wherein said first to fourth strip lines are connected to said internal grounding electrode via a via hole.

19. The laminated bandpass filter according to claims 15 or 16, further comprising:
  a fifth capacitor electrode connected to said input electrode;
  a sixth capacitor electrode connected to said output electrode;
  a seventh capacitor electrode capacitatively coupled with said fifth capacitor electrode; and
  an eighth capacitor electrode capacitatively coupled with said sixth capacitor electrode,
  wherein capacitive coupling of an area where said fifth capacitor electrode and said eighth capacitor electrode overlap each other in the lamination direction forms a jump capacitance.

20. The laminated bandpass filter according to claims 15 or 16, wherein capacitive coupling of an area where said sixth capacitor electrode and said seventh capacitor electrode overlap each other in the lamination direction forms a jump capacitance.

21. A high frequency device, characterized by comprising the laminated bandpass filter according to any one of claims 1, 6, 7, 15 and 16.

22. A composite high frequency device, wherein said laminated body incorporates the bandpass filter according to any one of claims 1, 6, 7, 15 and 16 and another high frequency circuit.

23. A composite high frequency device, wherein electronic parts are mounted on said laminated body incorporating the bandpass filter according to any one of claims 1, 6, 7, 15 and 16.

24. The laminated bandpass filter according to any one of claims 1, 6, 7, 15 and 16, wherein said dielectric sheet is made up of a crystal phase and a glass phase, said crystal phase includes at least one of $Al_2O_3$, $MgO$, $SiO_3$ and $RO_a$ where R is at least one element selected from La, Ce, Pr, Nd, Sm and Gd and a is a numerical value determined stoichiometrically according to the valence of said R.

25. A laminated bandpass filter manufacturing method comprising the steps of:
  forming an input electrode, output electrode and grounding electrode on an end face of a laminated body integrating a plurality of laminated dielectric sheets;
  forming an internal grounding electrode in an internal layer of said laminated body connected to said grounding electrode;
  forming a plurality of capacitor electrodes including at least first and second capacitor electrodes; and
  forming a plurality of strip lines including at least first and second strip lines,
  wherein said first and second capacitor electrodes are capacitatively coupled with said internal grounding electrode and electrically connected to ends of said first and second strip lines, respectively,
  the other ends of said first and second strip lines are electrically connected by way of via holes to the grounding electrode, and
  said first and second strip lines are placed on said same dielectric sheet in a certain distance and thereby electromagnetically coupled within the same layer.

26. A laminated bandpass filter manufacturing method comprising the steps of:
  forming an input electrode, output electrode and grounding electrode on an end face of a laminated body integrating a plurality of laminated dielectric sheets;
  forming an internal grounding electrode in an internal layer of said laminated body connected to said grounding electrode;
  forming a plurality of capacitor electrodes including at least first and second capacitor electrodes; and
  forming a plurality of strip lines including at least first and second strip lines,
  wherein said first and second capacitor electrodes are capacitatively coupled with said internal grounding electrode and electrically connected to ends of said first and second strip lines, respectively,
  the other ends of said first and second strip lines are electrically connected to the grounding electrode, and
  said first and second strip lines are each shaped in a straight line,
  (i) are placed on the same dielectric sheet,
  (ii) have the same length and width,
  (iii) are placed symmetrically with respect to a center line between said first and second strip lines, and
  (iv) said first and second strip lines are placed in parallel with each other through their entire lengths and separated by a certain distance, and thereby are electromagnetically coupled to each other within the same layer.

27. A laminated bandpass filter manufacturing method comprising the steps of:
  forming an input electrode, output electrode and grounding electrode on an end face of a laminated body integrating a plurality of laminated dielectric sheets;
  forming an internal grounding electrode in an internal layer of said laminated body connected to said grounding electrode;
  forming a plurality of capacitor electrodes including at least first and second capacitor electrodes; and
  forming a plurality of strip lines including at least first and second strip lines,
  wherein said first and second capacitor electrodes are capacitatively coupled with said internal grounding electrode and electrically connected to ends of said first and second strip lines, respectively,
  the other ends of said first and second strip lines are electrically connected to the grounding electrode, and
  said first strip line is placed on a first dielectric sheet,
  said second strip line is placed on a second dielectric sheet, and
  said second dielectric sheet is placed directly below said first dielectric sheet and thereby said first and second strip lines are electromagnetically coupled.

* * * * *